United States Patent [19]

Frerking

[11] Patent Number: 4,513,259
[45] Date of Patent: Apr. 23, 1985

[54] CLOSED LOOP TEMPERATURE COMPENSATED FREQUENCY REFERENCE

[75] Inventor: Marvin E. Frerking, Cedar Rapids, Iowa

[73] Assignee: Rockwell International Corporation, El Segundo, Calif.

[21] Appl. No.: 452,641

[22] Filed: Dec. 23, 1982

[51] Int. Cl.³ .............................................. H03L 1/00
[52] U.S. Cl. ..................................... 331/176; 331/66; 331/47; 368/202
[58] Field of Search ........................... 331/47, 66, 176; 368/202

[56] References Cited

U.S. PATENT DOCUMENTS

| | | | |
|---|---|---|---|
| 3,713,033 | 1/1973 | Frerking | 331/116 R |
| 3,719,838 | 3/1973 | Peduto et al. | 331/176 X |
| 4,297,657 | 10/1981 | Frerking | 331/176 |
| 4,305,041 | 12/1981 | Frerking | 328/155 |
| 4,380,745 | 4/1983 | Barlow et al. | 331/66 X |
| 4,454,483 | 6/1984 | Baylor | 331/176 X |

Primary Examiner—Eugene R. LaRoche
Assistant Examiner—Robert J. Pascal
Attorney, Agent, or Firm—Richard K. Robinson; George A. Montanye; H. Fredrick Hamann

[57] ABSTRACT

A closed loop frequency source includes a controllable oscillator that provides a first frequency source, a reference oscillator that provides a second signal, and a comparator that compares the two frequencies to provide an error signal that represents the difference between the frequencies. The error signal is used by an error signal generator to generate a compensation signal which offsets the carrier frequency that drives an output device such as a time-of-day clock so that the output device automatically gains or loses the previously accumulated time error without the necessity of being periodically updated.

8 Claims, 6 Drawing Figures

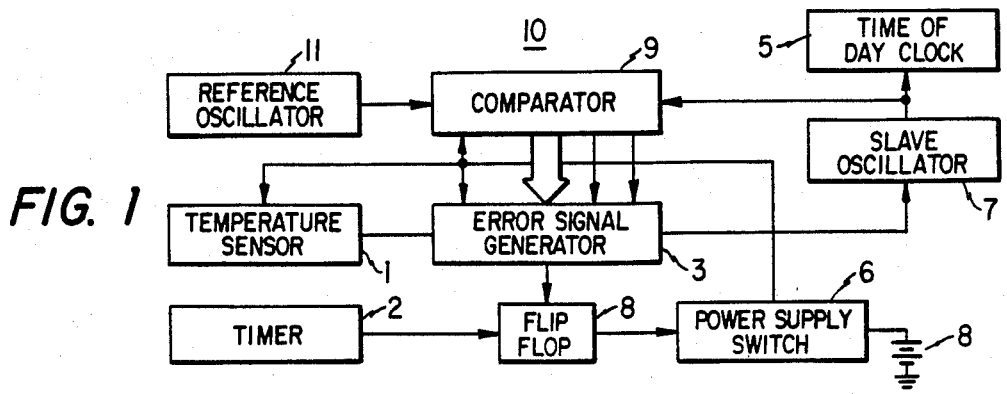
FIG. 1
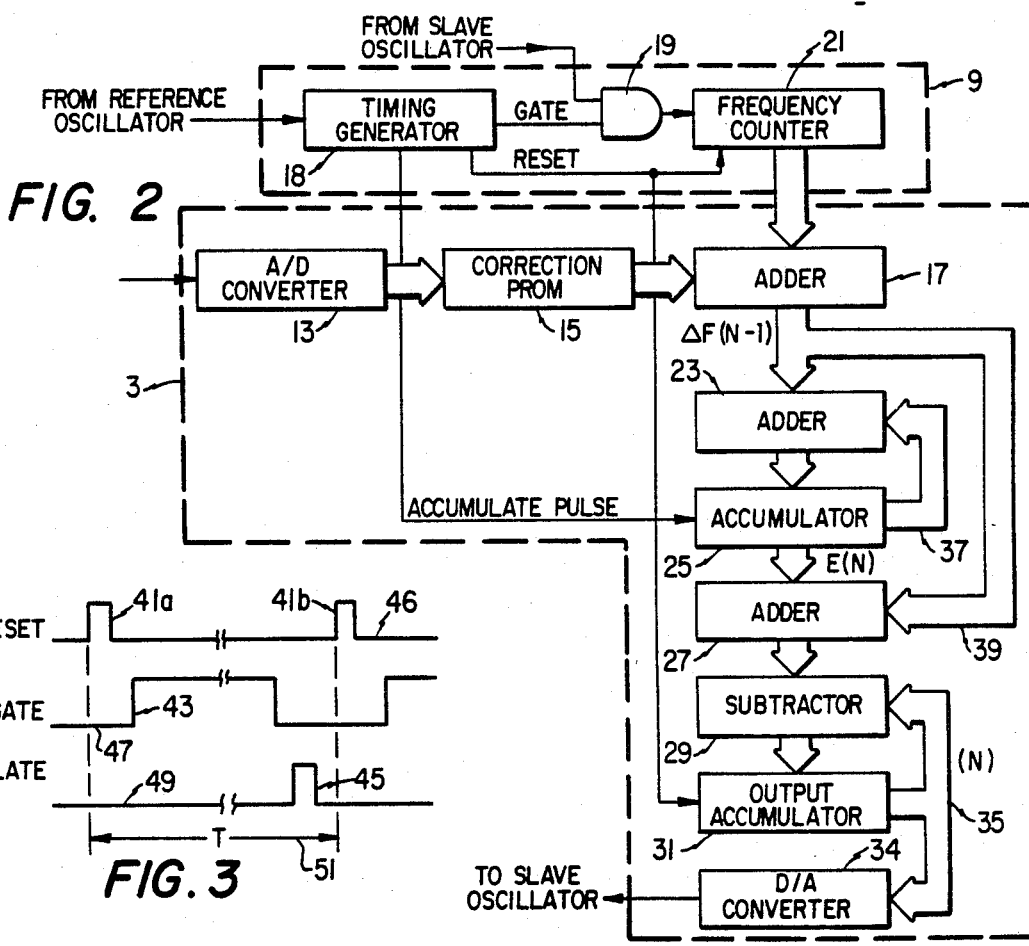
FIG. 2
FIG. 3
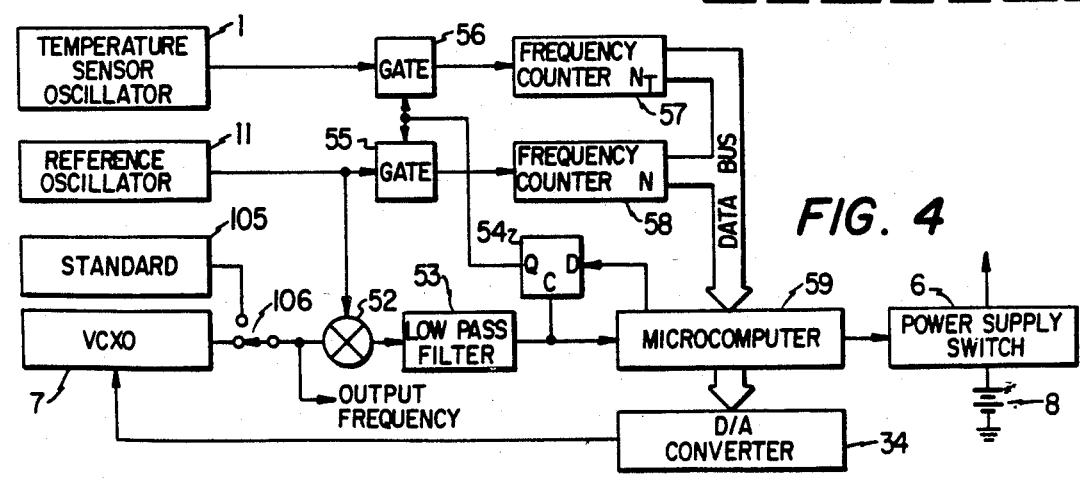
FIG. 4

CLOSED LOOP TEMPERATURE COMPENSATED FREQUENCY REFERENCE

BACKGROUND OF THE INVENTION

This invention relates to closed loop compensated frequency references and, in particular, to a closed loop compensated frequency reference containing a minimum mean error frequency source.

There are many current applications for oscillator circuits that require a high degree of accuracy in their output. An example of an application is in a secure communications system which requires a time-of-day clock.

In the prior art, the stringent accuracy requirements for an oscillator such as a crystal oscillator or a voltage-controlled oscillator require the selection of precision components, elaborate temperature control schemes, and relatively large quantities of power to drive the circuits. In the case of a portable device, such as a portable radio, that is required to synchronize its transmission with a precision time-of-day clock, the aforementioned requirements for building a precision clock oscillator become very prohibitive, not only in the area of expense, but also in the area of power consumption. The accuracy for a time-of-day clock that is used to synchronize a field radio that periodically changes frequencies, often is beyond the capabilities of conventional temperature compensated crystal oscillators. Thus, it is very difficult to provide an accurate time-of-day clock that is reasonably priced and operates on relatively low power.

Additionally, temperature compensation of such an oscillator driven clock, especially a crystal oscillator, normally involves measuring the temperature of the crystal, determining the frequency error of the crystal at the temperature and then applying a correction to a control signal which pulls the oscillator back on frequency. This, of course, results in many errors and because of the type of crystal which is normally used in this type of circuit, there are accelerated aging rates of the crystal which must also be compensated for, as well as frequency hysteresis effects.

U.S. Pat. No. 4,305,041 discloses a time compensated clock oscillator that has a low power oscillator that drives the time-of-day clock and a second accurate oscillator that is used to measure the frequency of the first oscillator. A correction signal is developed from the mixing of the two oscillators to periodically adjust the time-of day clock that is being driven by the circuitry.

Temperature compensation of a closed loop compensation reference oscillator was provided in my U.S. Pat. No. 4,297,657 which disclosed an oscillator that is temperature compensated by adjusting a slave oscillator with an error signal that is produced by using the temperature of a reference oscillator to determine the frequency error of the reference oscillator and then adjusts the frequency of the slave oscillator until its frequency coincides with the desired nominal value. The first of the above referenced oscillators required the provision of a data interface for interactions between the frequency source and the time-of-day clock while the latter requires that the measurement circuitry operate with a short duty cycle.

SUMMARY OF THE INVENTION

A closed loop frequency source includes a reference oscillator that provides a first reference frequency signal, a controllable oscillator that provides a first frequency signal, and a comparator that compares the two frequencies to provide an error signal that represents the difference between the frequencies. The error signal is used by an error signal generator to generate a compensation signal which offsets the carrier frequency that drives an output device such as a time-of-day clock so that the output device automatically gains or loses the previously accumulated time error without the necessity of being periodically updated.

It is the object of this invention to provide a closed loop compensated frequency reference which has a mean error frequency source.

It is another object of the invention to provide a closed loop compensated frequency reference that is temperature compensated.

It is still another object of the invention to provide a closed loop compensated frequency reference which is compensated periodically based on a selected sampling time.

BRIEF DESCRIPTION OF THE DRAWINGS

In order that the invention may be readily carried into practice, a number of embodiments will now be described in detail by way of example, with reference to the accompanying drawings in which:

FIG. 1 is a block diagram of a closed loop frequency reference according to the invention;

FIG. 2 is a block diagram of the error signal generator of the closed loop frequency reference of FIG. 1;

FIG. 3 is a timing diagram for the timing generator of the error signal generator of FIG. 2;

FIG. 4 is the preferred embodiment of a closed loop frequency reference according to the invention;

DETAILED DESCRIPTION OF THE PREFERRED EMBODIMENT

Figure 5:
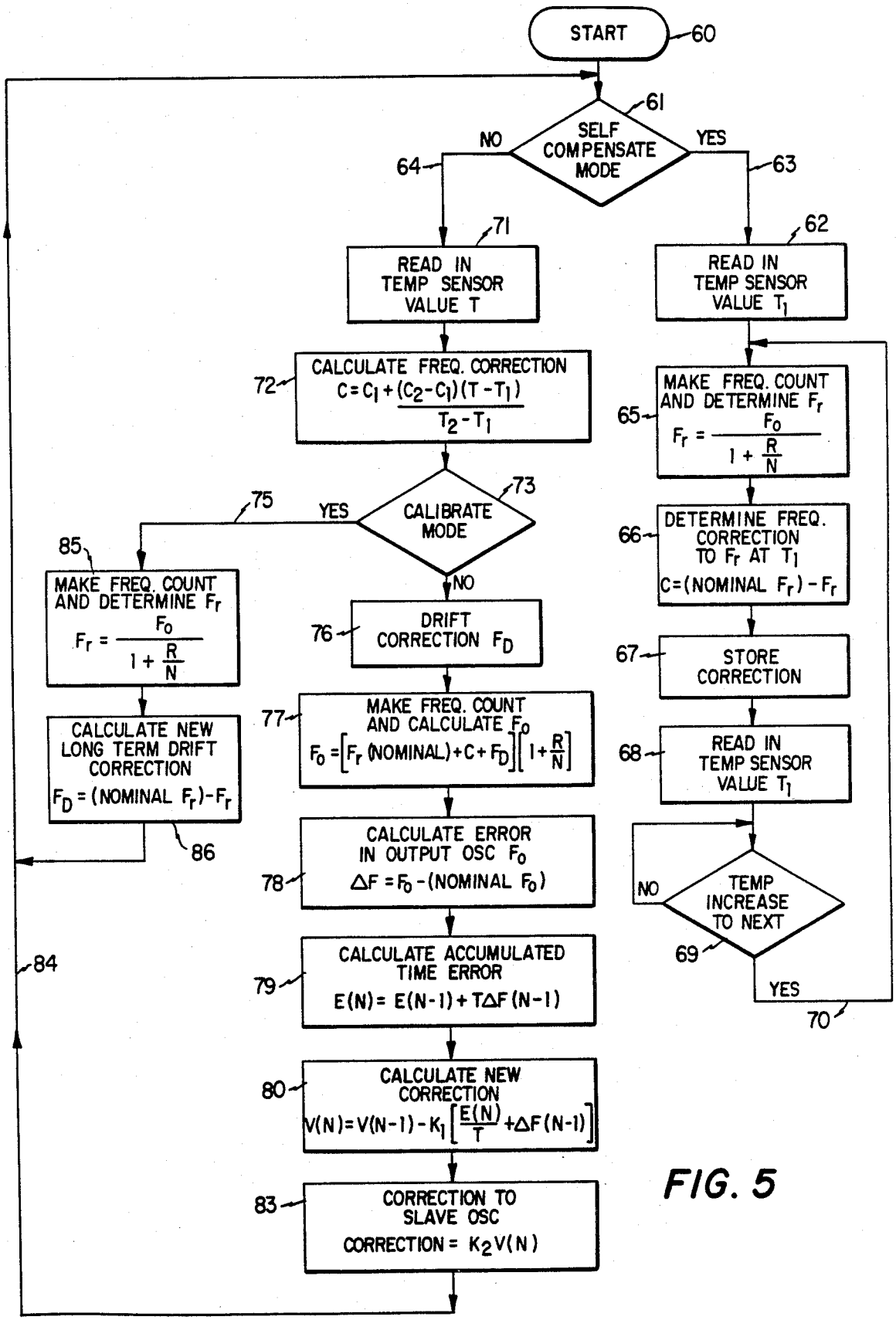
FIG. 5 is a flow diagram of the program for the microcomputer of FIG. 4.

FIG. 1, to which reference should now be made, shows a reference oscillator 11 that provides a stream of reference pulses to a comparator 9. Simultaneously with the application of the reference pulses to the comparator 9, a slave oscillator 7 also applies a stream of pulses to the comparator 9, as well as to the output device which is a device such as a time-of-day clock 5. The results of the comparison as made by the comparator 9 between the reference frequency that is provided by the reference oscillator 11 and the output frequency that is provided by the slave oscillator 7 is applied to an error signal generator 3. The error signal generator 3 provides the drive frequency to the slave oscillator 7, which will cause the slave oscillator 7 to either raise or lower the frequency of its output signal to correct for previously incurred discrepancies in the output frequency of the slave oscillator 7 and the reference oscillator 11. Additionally, the reference oscillator 11 is subject to having its output frequency vary with temperature. Consequently, provisions are made to compensate for any error discrepancies in the reference oscillator's output frequency for temperature variations through the use of a temperature compensation means that includes a temperature sensor 1, and correction circuitry that is contained within the error signal generator 3.

In some applications of the closed loop compensated frequency reference, such as a portable radio which has limited access to a power source, it is necessary to conserve power by limiting the application of the power to the circuitry that is contained within the oscillator. Consequently, the power is only applied to certain portions of the closed loop frequency reference during the times that measurements for frequency correction are performed. A timer 2 provides a periodic pulse to a flip-flop 8 which causes the power supply switch 6 to apply the power from the power source 18 to the comparator 9, the error signal generator 3, and the temperature sensor 1. After the completion of generating a correction factor for frequency correction of the slave oscillator 7, the error signal generator 3 will provide a reset signal to the flip-flop 8 which will cause the power supply switch 6 to remove the power from the comparator 9, the error signal generator 3 and the temperature sensor 1 which may be a device such as a thermister and an analog-to-digital converter.

For an understanding of the operation of the circuitry, FIGS. 1, 2 and 3 should be used simultaneously. The correction factor that is applied to the slave oscillator 7 whose output frequency is then varied so that the output device, such as the time-of-day clock, does not periodically have to be updated is provided by the equation $$V(N) = V(N-1) - K\left[\frac{E(N)}{T} + \Delta F(N-1)\right].$$

V(N) is a new correction factor that is applied to the slave oscillator 7 at the Nth sample time. V(N−1) is the correction factor that was applied during the period between the N−1 sample time and the Nth sample time. K is the gain factor for a stable system and is in the range of the embodiment shown in the FIGURES of from 0 to 4/3. E(N) is the accumulated time error up to the sample time N. T is the sample interval, and ΔF(N−1) is the average frequency during the interval between N−1 sample time and the Nth sample time.

The above referenced correction is provided by the circuitry of FIG. 2 where K is set equal to 1. The comparator 9 includes a timing generator 18, a gate circuit 19 and a frequency counter 21. The reference frequency from the reference oscillator 11 is applied to the timing generator 18 which periodically generates a reset pulse 41 by dividing down the reference frequency as shown in waveform 46 of FIG. 3. The reset pulse sets the frequency counter 21 to the negative of the nominal frequency, as well as loading an output accumulator 31 with the correction factor that is to be applied during the period of time between reset pulses 41. This is referred to as the sample period of time. Following the expiration of the first reset pulse 41a, a gate pulse is provided to the AND gate 19 (waveform 47 of FIG. 3), which ANDs the output of the slave oscillator 7 with a gate pulse 43, and applies the added signal to a frequency counter 21 which counts the number of pulses provided by the slave oscillator 7 during the period of time that the gate pulse 43 is present. The information from the frequency counter 21 is applied to the error signal generator 3 and in particular to an adder circuit 17. The adder circuit 17 in the embodiment of FIG. 2 is used to provide the temperature correction and that function may be implemented by the technique shown in my above referenced U.S. Pat. No. 4,297,657. Primarily, the temperature sensor 1 provides the temperature to an A/D converter 13 which converts the analog signal that is provided by the temperature sensor 1 (that senses the temperature of the reference oscillator) to a digital signal. A correction PROM 15 has stored therein a full range of correction factors that are stored in an address that corresponds to the digitized representation of the temperature sensed by the temperature sensor 1. Consequently, when a digital signal is provided by the A/D converter 13 and applied to the correction PROM 15, a correction factor is provided to the adder 17 that corresponds to the frequency error of the reference oscillator 11 at the temperature sensor 1. The adder 17 sums the temperature correction from the correction PROM 15 with the output of the frequency counter 21 and obtains a corrected error signal and applies the corrected error signal to an adder 23 as well as to an adder 27 via a data bus 39. The average frequency that has occurred during the interval between the N−1 sample or reset pulse 41a and the N reset pulse 41b that is represented by the time interval T and dimension lines 51 of FIG. 3 is accumulated by summing with the output of the adder 17, the output of a previously accumulated value that is stored within the accumulator 25. Data bus 37 feeds back the output of the accumulator 25 into the adder 23. At the occurrence of the accumulate pulse 45, the accumulator 25 is then updated and its output is applied to the adder 27 for summation with the output of the adder 17. The previous correction that was applied during the previous sample period is stored in the output accumulator 31. This information is applied to a subtractor 29 where the output of the adder 27 is subtracted from the previous correction factor as stored within the output accumulator 31 during the occurrence of the second reset pulse 41. The output accumulator is loaded with the correction factor from the subtractor 29 and applied to the D/A converter 34 whose output is used to drive the slave oscillator 7 during the period of time T between the reset pulses 41. The slave oscillator 7 frequency is thus either increased or decreased to compensate for previous accumulation errors and thus does not require exotic handshaking between the slave oscillator 7 and the time-of-day clock 5.

FIG. 4, to which reference should now be made, has the advantage over the embodiment shown in FIGS. 1 and 2 in that a mixer 52 is used to generate the gate signal and thus increases the accuracy of the comparison. In the embodiment of FIG. 1, K is set equal to 1 whereas K can be a variable in the embodiment of FIG. 4 because of the utilization of a microprocessor to perform the calculations necessary to obtain the correction V(N). The temperature sensor 1 of FIG. 4 is a temperature sensitive oscillator whose frequency is representative of the temperature and its output is applied to a gate 56 for gating into a frequency counter 57 which calculates the $N_T$ quantity, the number accumulated in a counter 57 from a temperature sensor oscillator 1. The output frequency from the reference oscillator is applied simultaneously to a gate 55 and also to the mixer 52 where it is mixed with the output of the slave oscillator, which in the case of FIG. 7 is a voltage-controlled crystal oscillator (VCXO) 7. The output frequency is mixed by the mixer 52 and applied to a low pass filter 53 and then to a microcomputer 59 which calculates based on a sample of reference oscillator frequency "N" that is stored within a frequency counter 58 and the temperature of the reference oscillator 11 that is represented by a sample $N_T$ from the temperature sensor oscillator 11 stored in the frequency counter 57. Both samples N and $N_T$ are taken when the discrepancies between the VCXO 7 and the reference oscillator provide a pulse long enough to pass through the low pass filter 53 and trigger the D flip-flop 54 if there is a logic one on its D terminal. The microcomputer 59 calculates the correction factor as based on the sample taken through the operation of the D flip-flop 54 which controls the gates 55 and 56, and applies it to the digital-to-analog converter 34 for adjustment of the voltage-controlled crystal oscillator (VCXO) 7. The low pass filter 53 passes the mixed signal to clock the D flip-flop 54 and to the gate duration counter in the microcomputer 59. Additionally, the microcomputer 59 provides a periodic pulse to the power supply switch 6 which applies power from the power source 8 to the following devices; temperature sensor oscillator 1, gates 55 and 56, frequency counters 57 and 58, and "D" flip-flop 54.

The reference oscillator 11 and the temperature sensor oscillator 1 are calibrated by preparing a correction table within the microcomputer 59. This table is generally built under laboratory conditions. In the calibrate mode or self-compensate mode, switch 106 connects standard 105 to the mixer 52 where it is mixed with the output of the reference oscillator 11 as the temperature of the reference oscillator 11 is received over the full range of expected operation. The temperature correction factor is then stored according to temperature as sensed by the temperature sensor oscillator 1.

FIG. 5 is a flow diagram of the programming of the microcomputer 59 and includes the initialization of the system at start point 60. The first decision block 61 decides if the unit is to operate in a self-compensation mode. The self-compensation mode enables the unit to build a temperature correction table for compensating for the error discrepancies in the reference oscillator 11 of FIG. 4. The temperature correction table includes corrections for $T_1$, $C_1$; $T_2$, $C_2$ through $T_N$, $C_N$ where $C_1$ through $C_N$ are the corrections for temperatures $T_1$ through $T_N$. By externally supplying the normal frequency $F_o$ from the standard 105 of FIG. 4 to the unit while it is exposed to a full range of temperatures of the reference oscillator 11, it is possible to build a table of correction for the reference oscillator 11 based on the temperature that is sensed by the temperature sensor 1. In the self-compensation mode, the microcomputer 59 implements loop 63 in which the first step 62 is to read in the temperature T from the temperature sensor oscillator 1 into the system. Since the gate period that is provided from the D flip-flop 54 to the gates 56 and 55 for counting is variable, the ratio of the value stored within counter 57 to the value in counter 58 is used to represent temperature. At block 65, the microprocessor makes a frequency count and determines $F_r$ by the enumerating equation in block 65 and the correction is stored at block 67 where R is equal to the number of beat nodes that occurs during the time that the gates 55 and 56 are enabled. A new temperature is read in at block 68 and if there is no increase in temperature at decision block 69 the device loops on itself. When there is an increase in temperature, the device uses loop 70 to go back to store another update within the microcomputer 59. After there is a full range of temperatures stored in for reference oscillator 11, at the decision block 61 the microcomputer 59 will go from the self-compensation mode to the nonself-compensation mode or operate mode.

At block 71 a value for the temperature "T" of the reference oscillator 11 is read in and forwarded to the next step. In block 72 a calculation is made according to the above equation for the new frequency correction. Decision block 73 decides if the unit is to go into the calibrate mode. If so, a frequency count is made and determined at block 85 and the new long turn drift correction which is called $F_d$ is performed at block 86. If not, then the drift correction $F_d$ is provided to make the frequency calculation $F_o$ which is performed at block 77 according to the illustrated equation. Block 78 calculates the change in frequency $\Delta F$ and at block 79 the accumulated time error $E_N$ is determined. At block 80 the new correction is performed and provided to the slave oscillator at block 83 via the D/A converter 34.

Figure 6:
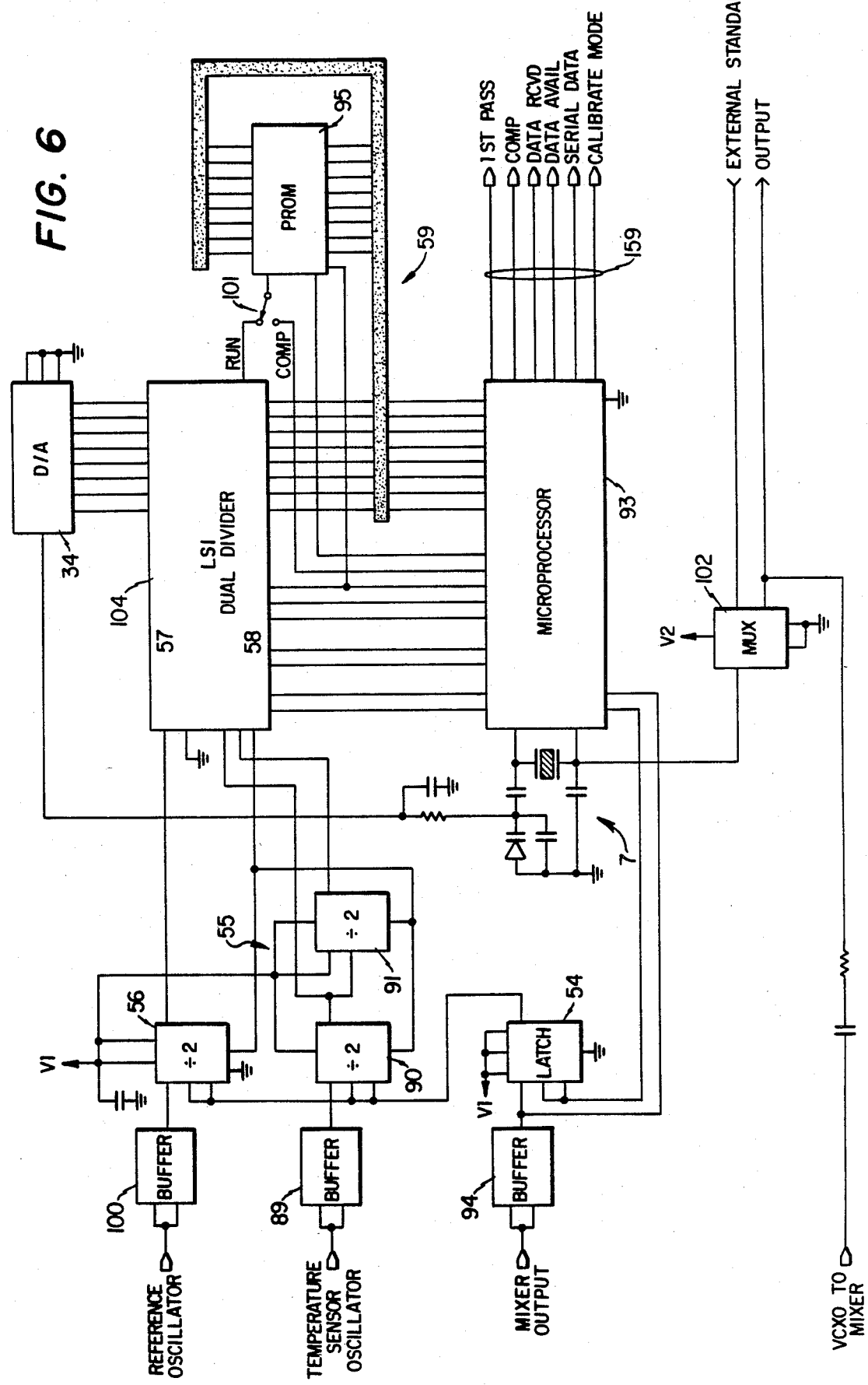
FIG. 6 is a schematic diagram of the closed loop temperature reference according to the invention.

FIG. 6 provides a simplified schematic diagram of the frequency counters 57 and 58 as well as the microcomputer 59 and should be referred to at this time. The interface of the microcomputer 59 between the digital-to-analog converter 34, the power switch 6 and the voltage-controlled oscillator 7 is provided as well as to the temperature sensor oscillator 1 and the reference oscillator 11. The input from the reference oscillator 11 is applied to a gate 56 via a buffer 100. The gate 56 is part of the counter 57 which in the preferred embodiment includes a divide-by-two counter primarily for speed compensation for the dual divider 104, the output of which is applied to the frequency counter 57 which is part of a dual divider 104. The output from the temperature sensor oscillator 1 is applied via buffer 89 to the gate 55 which includes two divide-by-two counters 90 and 91. The output of the gate 55 is applied to the frequency counter 58, also part of the dual divider 104.

In the case of the preferred embodiment, both the frequency counter 57 and the frequency counter 58 are contained on the single LSI chip. The correction factors for the temperature oscillator are stored in the PROM 95. The positioning of the switch 101 will determine if the unit will go in the self-compensation mode (if the switch 101 is connected to the COMP terminal) or the run mode (when the switch 101 is connected to the RUN terminal). In the run position the PROM 95 is read and of course in the COMP position the PROM 95 is loaded or written into. In the case of the preferred embodiment, the microcomputer 59 is a microprocessor chip 93 which is an Intel device 80C48. This device is able to unload data from the frequency counters 57 and 58 and transfer data from the devices to a D/A converter 34 which converts the information to an analog signal which is used to change the frequency of the slave oscillator 7 which is also used to generate the clock of the microprocessor 93. The output of the slave oscillator 7 is applied to a multiplexer 102 where it is used to drive the clock standard or time-of-day clock 5 of FIG. 1. It should be noted that during the compensation mode, the multiplexer accepts the output from the standards 106 for loading of the PROM 95. Control of the microprocessor 93 is provided by data bus 159.

Many changes and modifications in the above described invention can, of course, be carried out without departing from the scope thereof. Accordingly, the invention is intended to be limited only by the scope of the appended claims.

I claim:

1. A closed loop frequency reference comprising:
   controllable oscillator means for generating a first frequency signal in response to a control signal;
   reference oscillator means for generating a second frequency signal;
   comparator means for comparing the first frequency signal with the second frequency signal to obtain a composite signal; and
   error signal generator means for generating the control signal during a selected period of time, said error signal generator means including:
   frequency averaging means for averaging the first frequency signal between a preceding sample time and a current sample time representing a sample interval;
   first accumulator means for accumulating frequency error up to the current sample time;
   divisor means for obtaining a quotient of the accumulated frequency error over the sample interval;
   summing means for summing the quotient with the averaged first frequency to obtain a weighted frequency error; and
   subtractor means for subtracting the weighted frequency error from a previous correction factor to produce a new correction factor at the output of the subtractor means as the control signal.

2. The closed loop frequency reference according to claim 1 further comprising:
   sensor means for measuring the temperature of the reference oscillator means and to provide a temperature signal representative of the measured temperature; and
   combiner means for combining the temperature signal with the control signal to obtain a temperature compensated control signal to which the first frequency signal generating means will respond.

3. A closed loop temperature compensated frequency reference according to claim 2, wherein the sensor means comprises:
   a thermister mounted in close thermal proximity to the means for generating the second frequency; and
   means for digitizing the output of the thermister.

4. The closed loop temperature compensated frequency reference according to claim 3, wherein the sensor means comprises:
   a crystal oscillator whose frequency changes at a known rate with temperature.

5. The closed loop temperature compensated frequency reference according to claim 2, wherein the controllable oscillator means comprises:
   a variable frequency oscillator.

6. A method for providing a closed loop frequency reference comprising:
   generating a first frequency signal in response to a control signal;
   generating a second frequency signal with a reference oscillator;
   comparing the first frequency signal with the second frequency signal to obtain a composite signal; and
   generating the control signal during a selected period of time by:
   averaging the first frequency between a preceding sample time and a current sample time which represent a sample interval;
   accumulating a frequency error up to the current sample time;
   obtaining a quotient of the accumulated frequency error over the sample interval;
   summing the quotient with the averaged first frequency to obtain a weighted frequency error; and
   subtracting the weighted frequency error from a previous correction factor to produce a new correction factor as the control signal.

7. The method according to claim 6 further comprising the steps of:
   measuring the temperature of the reference oscillator to provide a temperature signal representative of the measured temperature; and
   combining the temperature signal with the control signal to obtain a temperature compensated control signal to which the first frequency signal will respond.

8. A frequency control system comprising:
   means for generating a first frequency signal in response to a control signal;
   means for generating a reference frequency;
   means for comparing said first frequency with said reference frequency to provide an output signal; and
   means for generating said control signal in response to said output signal during a selected period of time to produce a control signal represented by the difference between a previous correction signal and a current frequency error signal.

* * * * *